United States Patent
Celik et al.

(10) Patent No.: US 6,344,287 B1
(45) Date of Patent: Feb. 5, 2002

(54) HIGH TEMPERATURE COMPATIBLE INSULATION FOR SUPERCONDUCTORS AND METHOD OF APPLYING INSULATION TO SUPERCONDUCTORS

(75) Inventors: Erdal Celik; Yusuf Hascicek; Ibrahim Mutlu, all of Tallahassee, FL (US)

(73) Assignee: Florida State University, Tallahassee, FL (US)

( * ) Notice: Subject to any disclaimer, the term of this patent is extended or adjusted under 35 U.S.C. 154(b) by 0 days.

(21) Appl. No.: 09/124,148

(22) Filed: Jul. 28, 1998

Related U.S. Application Data

(63) Continuation-in-part of application No. 08/839,429, filed on Apr. 14, 1997, now abandoned.

(51) Int. Cl.$^7$ .......................... H01L 39/24; B32B 15/01; B32B 15/02
(52) U.S. Cl. .......................... 428/697; 428/469; 428/472; 428/699; 428/701; 428/702; 29/599; 174/125.1; 505/211; 505/700; 505/704; 505/705
(58) Field of Search .......................... 428/469, 472, 428/701, 702, 697, 699; 29/599; 174/125.1; 505/211, 700, 704, 705

(56) References Cited

U.S. PATENT DOCUMENTS

| | | | | | |
|---|---|---|---|---|---|
| 3,715,265 | A | * | 2/1973 | Allen et al. | 161/125 |
| 4,330,347 | A | * | 5/1982 | Hirayama et al. | 148/31.5 |
| 5,028,585 | A | * | 7/1991 | Spencer | 505/1 |
| 5,216,207 | A | * | 6/1993 | Prabbu et al. | 174/256 |
| 5,531,015 | A | * | 7/1996 | Manlief et al. | 29/599 |

\* cited by examiner

*Primary Examiner*—Deborah Jones
*Assistant Examiner*—Jennifer McNeil
(74) *Attorney, Agent, or Firm*—A. Jose Cortina; Kilpatrick Stockton LLP

(57) ABSTRACT

There is described a method of applying insulative coating on high temperature superconductors and low temperature superconductors from sol-gel solutions prepared from Zr or Zr with one of, Mg, Y, Ce, In and Sn based precursor materials. The solution is prepared with isopropanol as a solvent and acetyl acetone as a catalyst. The conductors are dipped into the solution and thereafter dried at a temperature effective to evaporate the solvent. Thereafter, heat treatment in the presence of oxygen is applied at a temperature sufficient to oxidize the precursors to result in a ceramic insulative coating on the conductor.

7 Claims, 4 Drawing Sheets

Low AC loss superconductor by decoupled filaments using sol-gel insulation.

Low AC loss superconductor by decoupled filaments using sol-gel insulation.

HIGH TEMPERATURE COMPATIBLE INSULATION FOR SUPERCONDUCTORS AND METHOD OF APPLYING INSULATION TO SUPERCONDUCTORS

CROSS-REFERENCE TO RELATED APPLICATIONS

This application is a continuation in part of application Ser. No. 08/839,429 filed Apr. 14, 1997, now abandoned.

BACKGROUND OF THE INVENTION

This invention relates generally to conductors having ceramic insulation applied thereto, and a method of applying such insulation using a sol-gel method. In particular, the invention relates to the application of $ZrO_2$, $MgO$—$ZrO_2$, $Y_2O_3$—$ZrO_2$, $CeO_2$—$ZrO_2$, $In_2O_3$—$ZrO_2$ and $SnO_2$—$ZrO_2$ coatings on temperature superconducting (HTS) conductors, e.g., Ag or AgMg sheathed Bi-2212, Bi-2223 and like tapes, and bronze processed (or like) multifilamentary low temperature superconducting (LTS) (e.g., $Nb_3Zn$, $Nb_3Ge$, $Nb_3Al$, $V_3Ga$, $V_3Si$, $(NbTi)_3Sn$, $Nb_3Sn_{1-x}Ga_x$, and like material) conductors. Other LTS conductors also include Cu(or CuSn)—$Nb_3$—Sn wires using a sol-gel technique.

In the manufacture of HTS and LTS magnets, it is often desirable to use composite tapes employing high temperature compatible insulating materials. Specifically, pancake coils are wound from HTS conductors in which a "wind and react" approach is used due to the brittle nature of the materials. As a result, it became necessary to use high temperature compatible insulating materials for turn-to-turn insulation in any magnet built from the high temperature superconductors. In the past, ceramic based papers or tapes were used for this purpose. However, a disadvantage with this type of approach is that such insulation, of course, takes up valuable winding space, and currently available materials have a thickness of about 0.1 mm. or greater.

The wind and react method of the prior art involved winding the precursor to a superconducting material around a mandrel in order to form a coil, and then processing the coil with high temperatures in an oxidizing environment. The processing method results in the conversion of the precursor material to a desired superconducting material, and in the healing of micro-cracks formed in the precursor during the winding process, thus optimizing the electrical properties of the coil. The superconducting coils, like most coils, are formed by winding an insulated conducting material around a mandrel defining the shape of the coil. When the temperature of the coil is sufficiently low that the conductor can exist in a superconducting state, the current performance of the conductor is increased and large magnetic fields can be generated by the coil.

As is well known, certain ceramic materials exhibit superconducting behavior at low temperatures, such as the compound $Bi_2Sr_2Ca_nCu_{n+1}O_{2n+4}$ where "n" can be either 0, 1, and 2. One material, $Bi_2Sr_2Ca_2Cu_3O_{10}$ (BSCCO(2223)), has performed particularly well in device applications because superconductivity and corresponding high current densities are achieved at relatively high temperatures, $T_c$=115°K. Other oxide superconductors include general Cu—O-based ceramic superconductors, such as members of the rare-earth-copper-oxide family (i.e., YBCO), thallium-barium-calcium-copper-oxide family (i.e., TBCCO), the mercury-barium-calcium-copper-oxide barium-calcium-copper-oxide family (i.e., HgBCCO), and BSCCO compounds containing lead (i.e., Bi, Pb)$_2$ $Sr_2Ca_2Cu_3O_{10}$).

Insulating materials surrounding the conductors are used to prevent electrical short circuits within the winding of a coil. From a design point of view, the insulation layer must be able to withstand large electric fields (as high as $4 \times 10^5$V/cm in some cases) without suffering dielectric breakdown, a phenomenon that leads to electrical cross-talk between neighboring conductors. At the same time, in the past, it was desired to make insulation layers as thin as possible (typically 50–150 $\mu$m) so that the amount of superconducting material in the coil can be maximized.

By using existing conducting and insulating materials, the maximum magnetic field generated by a superconducting coil is ultimately determined by the winding density (defined as the percentage of the volume of the coil occupied by the conductor) and the coil geometry. However, the large tensional forces necessary for high winding densities can leave conductors in highly stressed and/or strained states. The bend strain of a conductor, equal to half the thickness of the conductor divided by the radius of the bend, is often used to quantify the amount of strain imposed on the conductor through coil formation.

Thus, instead of the "wind and react" process previously discussed, one prior method used to fabricate coils with multi and mono-filament composite conductors is the "react and wind" process. This method first involves the formation of a insulated composite conductor which is then wound into a coil. A precursor to a composite conductor is fabricated and placed in a linear geometry, or wrapped loosely around a coil and placed in a furnace for processing. The precursor can therefore be surrounded by an oxidizing environment during processing, which is necessary for a conversion to the desired superconducting state. In the "react and wind" processing method, insulation can be applied after the composite conductor is processed, and materials issues such as oxygen permeability and thermal decomposition of the insulating layer do not need to be addressed.

In the "react and wind" process, the coil formation step can, however, result in straining composite conductors in excess of the critical strain value of the conducting filaments. Strain introduced to the conducting portion of the wire during the deformation process can result in micro-crack formation in the ceramic grains, severely degrading the electrical properties of the composite conductor.

Alternatively, in the "wind and react" process previously discussed, the eventual conducting material is typically considered to be a "precursor" until after the final heat treating and oxidation step. Unlike the "react and wind" process, the "wind and react" method as applied to high temperature superconductors requires that the precursor be insulated before coil formation, and entails winding the coil immediately prior to a final heat treating and oxidation step in the fabrication process. This final step results in the repair of micro-cracks incurred during winding, and is used to optimize the superconducting properties of the conductor. However, these results are significantly more difficult to achieve for a coil geometry than for the individual wires which are heat treated and oxidized in the "react and wind" process.

Due to the mechanical properties of the conducting material, superconducting coils fabricated using the "wind and react" approach with composite conductors have limitations related to winding density and current-carrying capability. Although the "wind and react" process may repair strain-induced damage to the superconducting material incurred during winding, the coils produced are not mechanically robust, and thermal strain resulting from cool down cycles can degrade the coil performance over time. Moreover, currently available insulation takes up a lot of winding space limiting the number of turns achievable, and further limiting the teslas at the highest field achievable in the bore of a magnet.

Currently, high temperature superconductors are produced using a powder in tube process which results in multifilamentary tapes or round wires of Bi-2212, Ag (or AgX where X=Mg, Zr, Al, Au, Y, etc.) or Bi-2223, Ag (or AgX). In the parent application to this application a sol-gel process is described to provide insulation to such tapes. In that process since zirconium oxide is already formed as an insulation layer, rolling is required to achieve a physical bond between the insulation and the coating. This is a complex procedure and sometimes does not result in a satisfactory bond.

Similarly, in the insulating of low temperature superconductors, wires are braided with a glass insulation applied. After heat treatment the glass insulation typically becomes very brittle, and often easily breaks off. This is an undesirable result.

The current invention avoids the problems of the prior art by providing a process where a chemical bond is established between the conductor and the insulation for both HTS and LTS conductors. Thus, a good bond is established and the problems of the prior art avoided.

SUMMARY OF THE INVENTION

In accordance with one aspect of the invention, there is provided a method of coating a conductor with an insulating composition. The method includes the steps of preparing a sol-gel coating solution with one of a Zr composition, or Zr composition with one of Mg, Y, Ce, In, and Sn composition based precursor materials in combination with a solvent and a catalyst. A conductor, which can be a high temperature superconductor such as a tape, or a low temperature superconductor such as a wire, as described herein, is dipped into the solution to coat the conductor with the solution. The solution is then dried at a temperature and for a time sufficient to evaporate the solvent. The coated conductor is then heated in an oxygen containing environment, such as air, at a temperature and for a time sufficient to result in a ceramic insulation coating. More preferably, the drying is conducted at a temperature of about 300° C. and the heating is conducted at a temperature of about 500° C. to about 650° C. Depending on the precursor, this results in an insulating coating which is either $ZrO_2$, $MgO—ZrO_2$, $Y_2O_3—ZrO_2$, $CeO_2—ZrO_2$, $In_2O_3$, $ZrO_2$ or $SnO_2—ZrO_2$. Similarly, Bi-2223 and like tapes can be insulated in accordance with the invention. Likewise, bronze processed (or like) multifilamentary low temperature superconducting (e.g., $Nb_3Zn$, $Nb_3Ge$, $Nb_3Al$, $V_3Ga$, $V_3Si$, $(NbTi)_3Sn$, $Nb_3Sn_{1-x}Ga_x$, and like materials) can be the conductors with which the invention is practiced.

In a more specific aspect, the conductor is Ag/Bi-2212 tape, AgMg/Bi-2212 tape, $Cu/Nb_3Sn$ wire or $Cu—Sn/Nb_3Sn$ wire.

The invention also relates to a conductor having a ceramic insulative coating, made in accordance with the method described above. The conductors and coatings are as also previously described.

BRIEF DESCRIPTION OF THE DRAWINGS

Having briefly described the invention, the same will become better understood from the following detailed discussion, made with reference to the attached drawings, in which.

DETAILED DISCUSSION OF THE INVENTION

As further developed herein, it has been recognized that work involved in developing high temperature superconductor and the processing of wind and react coils involving heat treatment with a thermal cycle at around 900° C. required development of an insulation application which is stable between room temperature to 900° C. and back to room temperature, and numerous cycles between room temperature while in actual use. Thus, the sol-gel process in accordance with the invention was initially developed for providing turn to turn electrical insulation for high temperature superconducting coils. The sol-gel process described herein is a low temperature chemical route for preparation of oxide ceramics. In accordance with the invention, the process provides an efficient method for preparing insulation coating on Ag or Ag alloy sheathed PIT Bi based HTS conductors. In addition, the invention can also be used on Cu or Cu alloy sheathed $Nb_3Sn$ wires which are LTS conductors. Other types of sheaths and conductor materials are further described herein.

Figure 1:
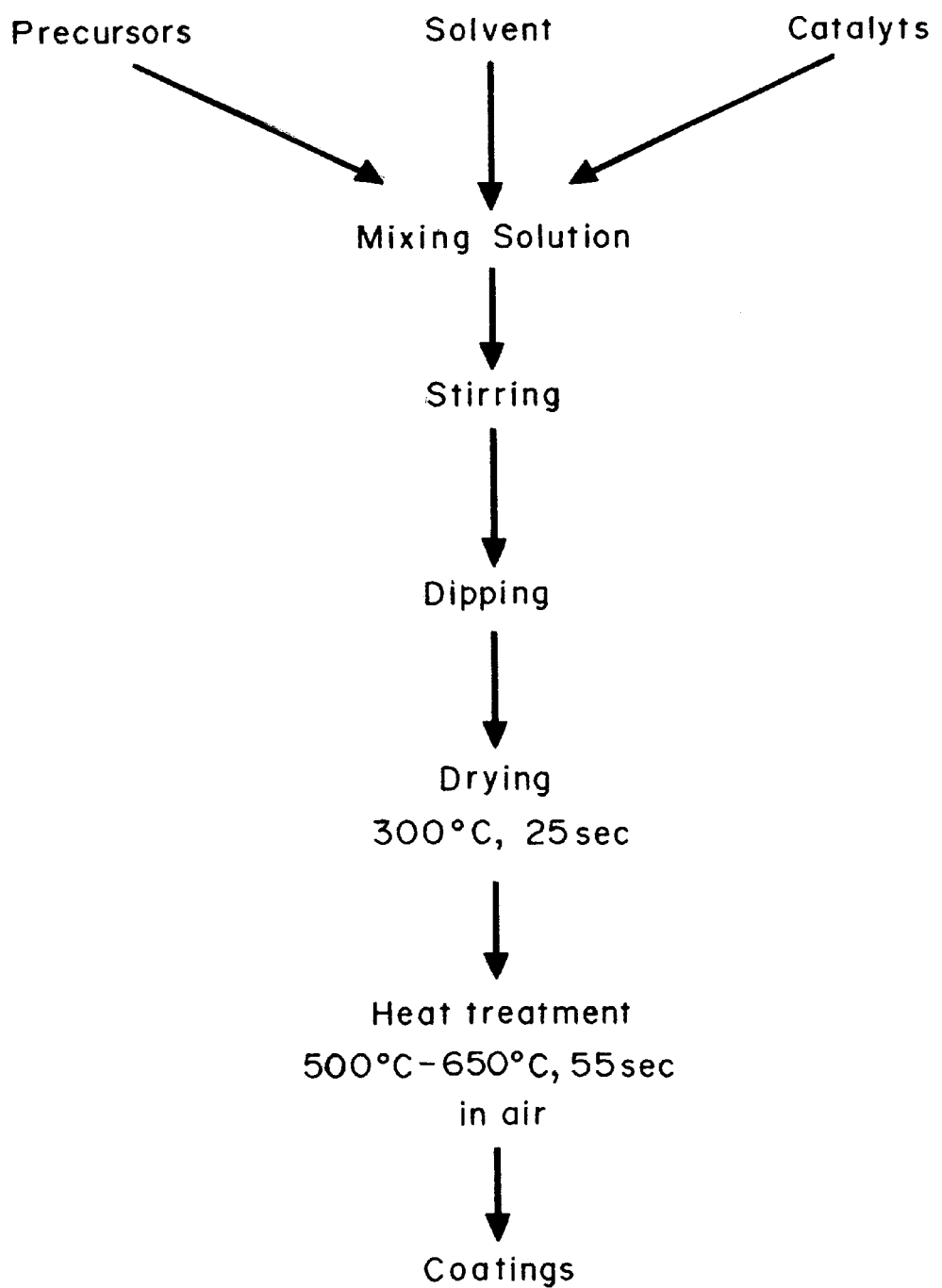
FIG. 1 is a process diagram showing the coating steps of the method of the invention.

In accordance with the invention as applied to HTS tapes, the surface of tape samples were cleaned with acetone in air so as to be free from any dirt, oil or scales. The clean tape was dipped into a sol-gel solution as further described herein. The tapes were then heat treated at varying temperatures, i.e., about 100° C.–about 600° C., and for varying times. Various dipping times and heat treatment conditions were tried for optimum coating performance. The decomposition temperature of zirconium organometallic compounds is approximately 450° C. Optical Microscopy, Environmental Scanning Electromicroscopy (ESEM), and x-ray diffraction (XRD) were used to study the microstructure and phase composition of insulation coatings obtained. Short Bi-2212/Ag tape samples were sol-gel dip coated and heat treated with uncoated control samples for partial melt texturing. Standard Jc measurements of these samples were carried out. No adverse effect on Jc due to insulation was observed. Once optimum coating conditions were determined, longer tape samples (1 m–15 m) were dipped through the solution with constant speed using motor drives. The general sol-gel process of the invention is generally shown in FIG. 1 hereof. This is a wheel to wheel operation including heat treatments. The wheel to wheel operation and the device for conducting this operation is better shown in FIG. 2 as further described hereafter. The dipping and heat treatment were repeated several times to obtain high resistance and uniform coating layers.

Figure 2:
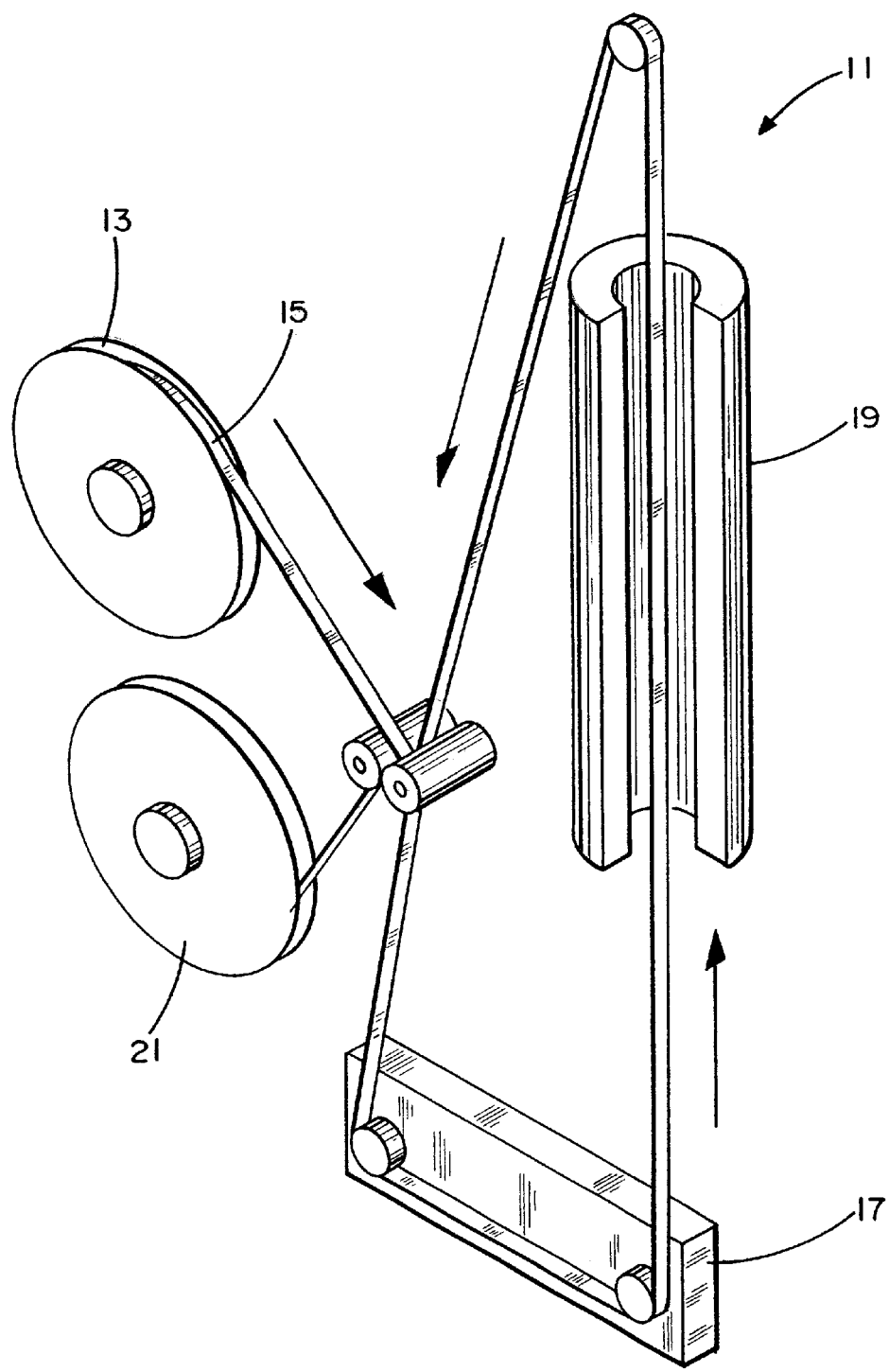
FIG. 2 is a schematic diagram of a spool to spool system for conducting the method of the invention.

More specifically, in the system 11 of FIG. 2, a conductor filament 15 is drawn from a spool 13. From spool 13, the filament, e.g, Bi-2212 or Bi-2223 encased in Ag or Ag alloy is passed or dipped in a sol-gel bath 17 of the invention. After coating therein, the coated filament 15 is passed through furnace 19 where it is first dried, then heat treated, i.e., heated to a predetermined temperature for a predetermined time, in the presence of oxygen, e.g., air, to result in the coatings of the invention. From the furnace 19 now insulation coated filament 15 is passed onto spool 21.

It is important to appreciate that in conducting the process as the coating is transformed to form the insulation, it forms a chemical bond with the metal sheath. Thus, the bond is much stronger than the bond achieved in the spray insulation process of the prior parent application, where rolling to achieve a physical bond is required.

During the coating operation, it was observed that the sol-gel coated samples stayed fairly bright yellow up to 300° C. They turned brown-gray at about 450° C., and they turned black at 600° C. The thickness of the coating was controlled by changing the withdrawal speed and/or the zirconium content in the solution. Using typical ESEM analysis, although a large number of cracks were observed, there was no flaking off in all of the studies. The presence of cracks is not detrimental as far as this application is concerned. It may be advantageous to have such cracks due to increased surface area which could improve the mechanical integrity of the finished magnets after epoxy impregnation. As noted previously, the thickness of the sol-gel insulation coatings is a lot less than what can be achieved by other spray coating methods as described in the prior application for use on HTS coils. If a thicker coating is desired, multiple dippings can be done to achieve desired thickness. Further, in an alternative, the sol-gel components can be altered to result in a thicker or more viscous solution as will be apparent from the following description.

In accordance with the invention, it has also been discovered that the sol-gel insulation process is applicable to low temperature superconducting (LTS) magnet application as further described herein.

Thus, in a broader application, the invention was specifically directed to the application of $ZrO_2$, $MgO$—$ZrO_2$, $Y_2O_3$—$ZrO_2$, $CeO_2$—$ZrO_2$, $In_2O_3$—$ZrO_2$ and $SnO_2$—$ZrO_2$ coatings on Ag and AgMg sheathed Bi-2212 tapes (HTS conductors) and Cu (or Cu—Sn)—$Nb_3Sn$ wires (LTS conductors) using the sol-gel process in accordance with the invention. Of course, other types of superconductors can be used, but the above are set forth as illustrative. Other types of conductors to which the invention can be applied have been previously described and those and others will be readily apparent to those of ordinary skill in the art.

For example, while Bi-2212 tapes have been described, Bi-2223 and the like can also be conductors coated in accordance with the invention. In the case of Bi-2212 or Bi-2223, although the sheath is described as being Ag or AgMg, alternatives can include AgMg, Ni and various alloys thereof, AgZr, AgAl, AgAu or AgY. For LTS conductors, although $Nb_3Sn$ wires have been specifically described, such conductors can include others such as typically bronzed processed (or like) multifilamentary low temperature conductors such as $Nb_3Sn$, $Nb_3Ge$, $Nb_3Al$, $V_3Ga$, $V_3Si$, (NbTi)$_3$Sn. $Nb_3Sn_{1-x}Ga_x$ and like materials. Similarly, though Cu or CuSn have been indicated as the sheath, other materials can include, e.g., CuSn, CuSi, CuGe, CuGa, CuAl or other like materials.

Figure 3:
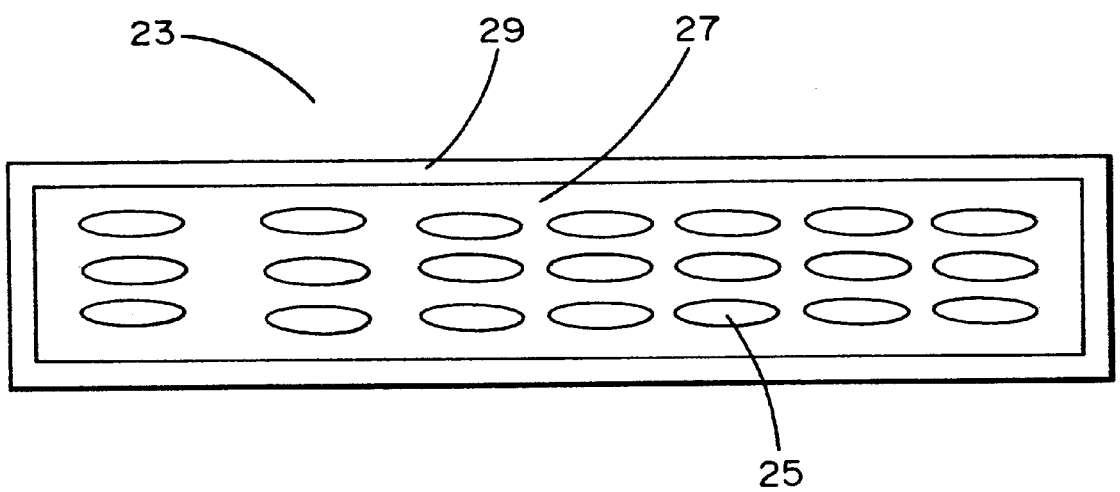
FIG. 3 is a cross-section schematic diagram of a conductor of the type coated in accordance with the invention.

FIG. 3 shows such a typical coated conductor 23, having superconductor filaments 25, e.g., Bi-2212, in a matrix 27 of, e.g., Ag or Ag alloy, having had insulation deposited thereon in accordance with the invention.

Figure 4:
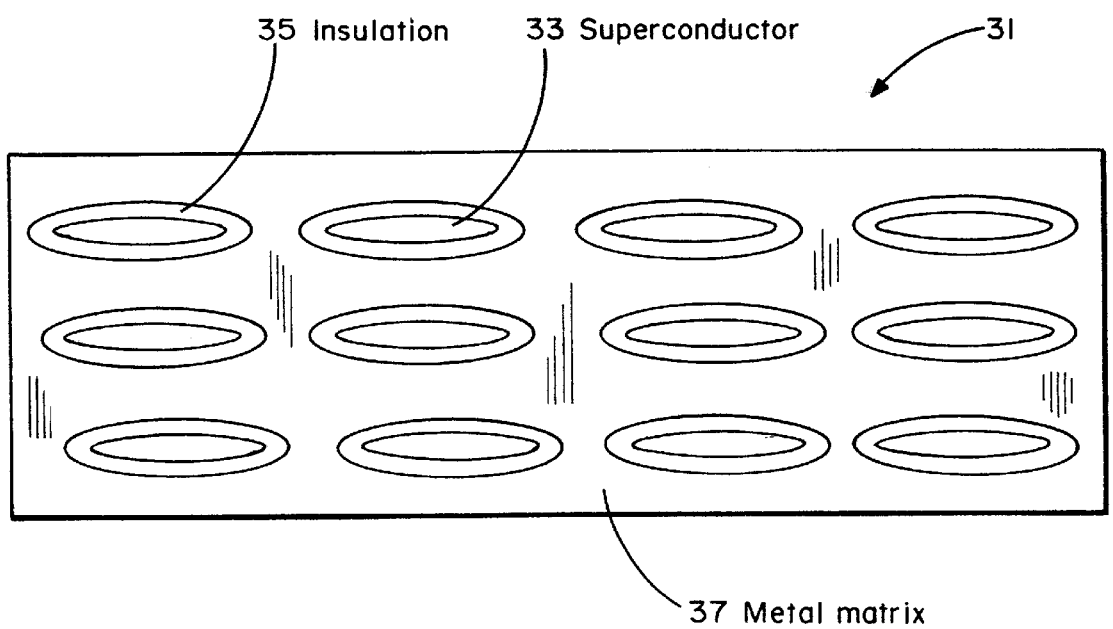
FIG. 4 is a cross-section view of a low AC loss superconductor made up of decoupled filaments having sol gel insulation layers.

FIG. 4 shows a low AC loss superconductor 31 made up of individual filaments 33 which have been coated with insulation 35 in accordance with the invention. After the insulation 35 is applied, the filaments are inserted into metal matrix 37, for example, Ag or Ag alloy.

EXAMPLES

In accordance with the examples set forth in the following tables, the sol-gel solutions were prepared for Zr, and Zr with each one Mg, Y, Ce, In and Sn based precursor materials. Isopropanol was used as a solvent and acetyl acetone was used as a catalyst. Purity of the precursor materials was checked with titration methods before preparing the solution. After hydrolysis, the resulting sols were clear and stable at room temperature.

| Conductors | Coatings | Solutions | Formula | Ratios in sol. (gr) |
|---|---|---|---|---|
| 1. HTS | $ZrO_2$ | Zirconiumtetrabutoxide | $Zr[O(CH_2)_3CH_3]_4$ | 38.37 |
| | | Isopropanol | $CH_3CHOHCH_3$ | 191.85 |
| | | Acetyl acetone | $CH_3COCH_2COCH_3$ | 10.12 |
| 2. HTS | $MgO$—$ZrO_2$ | Zirconiumtetrabutoxide | $Zr[O(CH_2)_3CH_3]_4$ | 38.37 |
| | | Isopropanol | $CH_3CHOHCH_3$ | 228.00 |
| | | Acetyl acetone | $CH_3COCH_2COCH_3$ | 10.12 |
| | | Magnesium 2,4-pentanedionate | $Mg(C_5H_7O_2)_25H_2O$ | 13.00 |
| 3. HTS | $Y_2O_3$—$ZrO_2$ | Zirconiumtetrabutoxide | $Zr[O(CH_2)_3CH_3]_4$ | 38.37 |
| | | Isopropanol | $CH_3CHOHCH_3$ | 228.00 |
| | | Acetyl acetone | $CH_3COCH_2COCH_3$ | 10.12 |
| | | Yttrium nitrate or | $Y(NO_3)_35H_2O$ | 7.84 |
| | | Yttrium isoproxide | $Y[OCH(CH_3)_2]_3$ | 7.41 |
| 4. HTS | $CeO_2$—$ZrO_2$ | Zirconiumtetrabutoxide | $Zr[O(CH_2)_3CH_3]_4$ | 38.37 |
| | | Isopropanol | $CH_3CHOHCH_3$ | 191.85 |
| | | Acetyl acetone | $CH_3COCH_2COCH_3$ | 10.12 |
| | | Cerium (III) 2,4 pentanedionate | $Ce(C_5H_4O_2)_3xH_2O$ | 7.77 |
| 5. LTS | $In_2O_3$—$ZrO_2$ | Zirconiumtetrabutoxide | $Zr[O(CH_2)_3CH_3]_4$ | 38.37 |
| | | Isopropanol | $CH_3CHOHCH_3$ | 191.85 |
| | | Acetyl acetone | $CH_3COCH_2COCH_3$ | 10.12 |
| | | Indium oxide or | $In_2O_3$ | 2.97 |
| | | Indium isoproxide | $InY(OC_3H_7)_3$ | 124.90 ml |
| 6. LTS | $SnO_2$—$ZrO_2$ | Zirconiumtetrabutoxide | $Zr[O(CH_2)_3CH_3]_4$ | 38.37 |
| | | Isopropanol | $CH_3CHOHCH_3$ | 191.85 |
| | | Acetyl acetone | $CH_3COCH_2COCH_3$ | 10.12 |
| | | Tin oxide | $SnO_2$ | 3.00 |

The solutions (1–4) were used for coatings on Ag and AgMg sheathed Bi-2212 tapes (HTS tapes), and the solutions (5–6) were used for coating on Cu (or Cu—Sn)—$Nb_3Sn$ wires (LTS wire) by dipping. The gel coated substrates were generally dried at temperature of about 300° C. for about 25 sec and then heat treated at temperature of about 500° C. to about 650° C. for about 55 sec at 1 dipping in air (oxygen containing environment) as seen at FIG. 1. Table 2 shows the sol-gel insulation coating parameters for HTS tape and LTS wire conductors.

TABLE 1

The sol-gel dipping parameters for insulated materials

| Coatings | Matrix | Number of dipping | Withdrawal rate (cm/sec) | Drying | Heat treatment |
|---|---|---|---|---|---|
| $ZrO_2$ | Ag or AgMg/ Bi-2212 | 13 | 2.12 | 300° C., 25 sec | 500° C., 55 sec |
| $MgO$—$ZrO_2$ | Ag or AgMg/ Bi-2212 | 6 | 2.12 | 300° C., 25 sec | 650° C., 55 sec |
| $Y_2O_3$—$ZrO_2$ | Ag or AgMg/ Bi-2212 | 7 | 2.12 | 300° C., 25 sec | 650° C., 55 sec |
| $CeO_2$—$ZrO_2$ | Ag or AgMg/ Bi-2212 | 7 | 2.12 | 300° C., 25 sec | 600° C., 55 sec |
| $In_2O_3$—$ZrO_2$ | Cu or Cu—Sn/ $Nb_3Sn$ | 6 | 2.12 | 300° C., 25 sec | 500° C., 55 sec |
| $SnO_2$—$ZrO_2$ | Cu or Cu—Sn/ $Nb_3Sn$ | 6 | 2.12 | 300° C., 25 sec | 500° C., 55 sec |

The coatings achieved and growth mechanisms were evaluated by ESEM, SEM, EDS, XRD and DTA. Adhesive strength of the coatings which resulted from chemical bonding were evaluated by using a minitensile testing machine. The properties of the coatings in all categories were found to be highly desirable and acceptable for use.

The foregoing descriptions of preferred embodiments of the processing methods and related inventions have been presented for purposes of illustration and description. They are not intended to be exhaustive or to limit the invention to the precise form disclosed. The embodiments chosen are described in order to best explain the principles of the processing method and invention, and the articles assembled thereby.

What is claimed is:

1. A conductor having a ceramic electrically insulative coating, comprising:

said insulative coating having been applied by dipping the conductor in a sol gel coating solution made up of one of; 1) Zirconium tetrabutoxide; 2) Zirconium tetrabutoxide and Magnesium 2,4-pentadionate; 3) Zirconium tetrabutoxide and Yttrium nitrate; 4) Zirconium tetrabutoxide and Yttrium isoproxide; 5) Zirconium tetrabutoxide and Cerium (III) 2,4 pentadionate; 6) Zirconium tetrabutoxide and Indium oxide; 7) Zirconium tetrabutoxide and Indium isoproxide; and 8) Zirconium tetrabutoxide and Tin oxide; a solvent; and a catalyst;

drying the dip coated conductor at a temperature and for a time sufficient to evaporate the solvent and catalyst; and heating the conductor in an oxygen containing atmosphere at a temperature and for a time sufficient to result in the ceramic electrically insulative coating which is one of 1) $ZrO_2$, 2) $MgO$—$ZrO_2$, 3) $Y_2O_3$—$ZrO_2$, 4) $CeO_2$—$ZrO_2$, 5) $In_2O_3$—$ZrO_2$, and 6) $SnO_2$—$ZrO_2$, and the ceramic coating being chemically bonded to the conductor.

2. A conductor as in claim 1 wherein said catalyst is acetyl acetone and said solvent is isopropanol.

3. A conductor as in claim 1 wherein said conductor is made up of a matrix of one of Ag/Bi-2212 and AgMg/Bi-2212, and said resultant insulative coating is made of $MgO$—$ZrO_2$.

4. A conductor as in claim 1 wherein said conductor is made up of a matrix of one of Ag/Bi-2212 and AgMg/Bi-2212, and said resultant insulative coating is made of $Y_2O_3$—$ZrO_2$.

5. A conductor as in claim 1 wherein said conductor is made up of a matrix of one of Ag/Bi-2212 and AgMg/Bi-2212, and said resultant insulative coating is made of $CeO_2$—$ZrO_2$.

6. A conductor as in claim 1 wherein said conductor is made up of a matrix of one of $Cu/Nb_3Sn$ and $Cu$—$Sn/Nb_3Sn$, and said resultant insulative coating is made of $In_2O_3$—$ZrO2$.

7. A conductor as in claim 1 wherein said conductor is made up of a matrix of one of $Cu/Nb_3Sn$ and $Cu$—$Sn/Nb_3Sn$, and said resultant insulative coating is made of $SnO_2$—$ZrO_2$.

* * * * *

UNITED STATES PATENT AND TRADEMARK OFFICE
CERTIFICATE OF CORRECTION

PATENT NO. : 6,344,287 B1
DATED : February 5, 2002
INVENTOR(S) : Erdal Celik, Yusuf Hascicek and Igrahim Mutlu It is certified that error appears in the above-identified patent and that said Letters Patent is hereby corrected as shown below:

<u>Column 1,</u>
Line 23, after "$Nb_3$" add (in subscript format) -- - -- so that it is shown as -- $Nb_{3-}$ --

<u>Column 3,</u>
Line 29, after "composition, or" add -- a --

<u>Column 6,</u>
Line 4, on the line after "room temperature." Insert -- Table 1. Properties of precursor materials. --
Line 47, change "Table 1" to -- Table 2 --

Signed and Sealed this

Eleventh Day of June, 2002

*Attest:*

*Attesting Officer*

JAMES E. ROGAN
*Director of the United States Patent and Trademark Office*